United States Patent
Xiong

(10) Patent No.: US 9,507,217 B2
(45) Date of Patent: Nov. 29, 2016

(54) LCD PANEL AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Yuan Xiong, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 7 days.

(21) Appl. No.: 14/417,078

(22) PCT Filed: Dec. 23, 2014

(86) PCT No.: PCT/CN2014/094585
§ 371 (c)(1),
(2) Date: Jan. 23, 2015

(87) PCT Pub. No.: WO2016/095243
PCT Pub. Date: Jun. 23, 2016

(65) Prior Publication Data
US 2016/0178971 A1  Jun. 23, 2016

(30) Foreign Application Priority Data

Dec. 17, 2014  (CN) .......................... 2014 1 0789898

(51) Int. Cl.
*G02F 1/1343* (2006.01)
*G02F 1/1362* (2006.01)
*G02F 1/1368* (2006.01)
*H01L 27/12* (2006.01)

(52) U.S. Cl.
CPC ....... *G02F 1/134309* (2013.01); *G02F 1/1368* (2013.01); *G02F 1/136213* (2013.01); *G02F 1/136227* (2013.01); *H01L 27/124* (2013.01); *H01L 27/1255* (2013.01); *H01L 27/1259* (2013.01); *G02F 2001/134345* (2013.01)

(58) Field of Classification Search
CPC .................................................... G02F 1/1343
USPC ........................................................... 349/38
See application file for complete search history.

(56) References Cited

U.S. PATENT DOCUMENTS

| 7,483,096 B2* | 1/2009 | Roh | G02F 1/133514 349/106 |
| 2009/0273749 A1* | 11/2009 | Miyamoto | G02F 1/13394 349/114 |
| 2013/0320317 A1* | 12/2013 | Lee | H01L 29/78606 257/40 |

* cited by examiner

Primary Examiner — Lucy Chien

(57) ABSTRACT

An LCD panel and a manufacturing method thereof are provided, the panel includes a first substrate, a second substrate, and a liquid crystal layer. The first substrate is disposed with a pixel electrode, a TFT and a storage capacitor. The pixel electrode includes a main pixel area and a sub-pixel area. A first color resistance thickness of the main pixel area is greater than a second color resistance thickness of the sub-pixel area. The present invention improves the displaying effect of a large view angle via various color resistances thicknesses.

14 Claims, 5 Drawing Sheets

LCD PANEL AND MANUFACTURING METHOD THEREOF

BACKGROUND OF THE INVENTION

1. Field of the Invention

The present invention relates to displaying field, and more specifically to an LCD (Liquid Crystal Displayer) panel and a manufacturing method thereof.

2. Description of the Prior Art

The traditional LCD panel has a relatively narrow visual angle, when standing by a side of the LCD panel, a viewer cannot watch clearly the image displayed on the LCD panel. Therefore, in recent years the industry has started the researching and production on LCD panels with the wide visual angle.

The wide visual angle regularly includes: by using a pixel electrode with a special pattern, liquid crystal molecules in different areas are led to have tilt angles of different directions when applying an electric field to the LCD panel, thereby realizing a wide visual angle. The pixel electrode is electrically connected to an active component via a through hole and a connection pattern typically. However, the connection pattern will raise a part of the pixel electrode, so a structure like this will lead a chaos to the tilt directions of the liquid crystal molecules nearby the connection pattern. However, once the liquid crystal molecules tilt to unexpected directions, the light transmittance of the liquid crystal display panel will be decreased adversely, thereby affecting the displaying effect and unable to realize a stabilized wide visual angle function.

SUMMARY OF THE INVENTION

Accordingly, an LCD panel and a manufacturing method thereof is provided in the present invention, to solve the technical problems in the prior art of the low light transmittance and the easy tilting of liquid crystals which lead to be unable to provide a stable wide visual function.

To overcome the above-mentioned disadvantages, the technical scheme of the present invention is illustrated hereunder.

An LCD panel, comprises a first substrate, a second substrate, and a liquid crystal layer between the first substrate and the second substrate, wherein the LCD panel further comprises the following on the first substrate:

a pixel electrode comprising at least one main pixel area, at least one sub-pixel area, at least one first transitional pixel area, and at least one second transitional pixel area, wherein a first color resistance thickness of the main pixel area is greater than a second color resistance thickness of the sub-pixel area, the first transitional pixel area is disposed between the main pixel area and the sub-pixel area, a third color resistance thickness of the first transitional pixel area is between the first color resistance thickness and the second color resistance thickness, and the third color resistance thickness is a preset height or has heights in a gradient range, the second transitional pixel area is disposed on one side or two sides of the first through hole and/or the second through hole, and a fourth color resistance thickness of the second transitional pixel area has heights in a gradient range decreasing from the first color resistance thickness or from the second color resistance thickness;

a TFT connected to a data line, a scanning line and the pixel electrode respectively; and a storage capacitor connected to the pixel electrode.

Preferably, the first transitional pixel area is shaped to be triangular, stepped, or circular arc.

Preferably, the first through hole penetrates from the pixel electrode to the TFT, and a metal layer is laid on a surface of the pixel electrode and the first through hole to form the data line, for connecting the data line to the pixel electrode.

Preferably, the second through hole penetrates from the pixel electrode to the storage capacitor, and a metal layer is laid on the surface of the pixel electrode and the second through hole, for connecting the pixel electrode and the storage capacitor.

Preferably, the second transitional pixel area is shaped to be triangular, stepped, or circular arc.

Preferably, the TFT comprises:

a gate electrode connected to the scanning line;

a source electrode connected to the data line, for receiving inputted electrons;

a drain electrode connected to the pixel electrode, for outputting the electrons; and an active layer made by indium gallium zinc oxide, for forming an electric conducting channel.

To overcome the above-mentioned disadvantages, the technical scheme of the present invention is illustrated hereunder.

An LCD panel, comprises a first substrate, a second substrate, and a liquid crystal layer between the first substrate and the second substrate, wherein the LCD panel further comprises the following on the first substrate:

a pixel electrode comprising at least one main pixel area and at least one sub-pixel area, wherein a first color resistance thickness of the main pixel area is greater than a second color resistance thickness of the sub-pixel area;

a TFT connected to a data line, a scanning line and a pixel electrode respectively; and a storage capacitor connected to the pixel electrode.

Preferably, the pixel electrode further comprises at least one first transitional pixel area disposed between the main pixel area and the sub-pixel area, a third color resistance thickness of the first transitional pixel area is between the first color resistance thickness and the second color resistance thickness, and the third color resistance thickness is a preset height or has heights in a gradient range.

Preferably, the first transitional pixel area is shaped to be triangular, stepped, or circular arc.

Preferably, a first through hole is formed on the pixel electrode, the first through hole penetrates from the pixel electrode to the TFT, and a metal layer is laid on a surface of the pixel electrode and the first through hole to form the data line, for connecting the data line to the pixel electrode.

Preferably, a second through hole is formed on the pixel electrode, the second through hole penetrates from the pixel electrode to the storage capacitor, and a metal layer is laid on a surface of the pixel electrode and the second through hole, for connecting the pixel electrode and the storage capacitor.

Preferably, the pixel electrode further comprises a second transitional pixel area disposed on one side or two sides of the first through hole and/or the second through hole, a fourth color resistance thickness of the second transitional pixel area has heights in a gradient range decreasing from the first color resistance thickness or the second color resistance thickness.

Preferably, the second transitional pixel area is shaped to be triangular, stepped, or circular arc.

Preferably, the TFT comprises:

a gate electrode connected to the scanning line;

a source electrode connected to the data line, for receiving inputted electrons;

a drain electrode connected to the pixel electrode, for outputting the electrons; and an active layer made by indium gallium zinc oxide, used to form an electric conducting channel.

To overcome the above-mentioned disadvantages, the technical scheme of the present invention is further illustrated hereunder.

A manufacturing method for an LCD panel, which comprises the following steps:

preparing a first substrate;

preparing a TFT, a storage capacitor and a pixel electrode on the first substrate, the pixel electrode comprises at least one main pixel area and at least one sub-pixel area, a first color resistance thickness of the main pixel area is greater than a second color resistance thickness of the sub-pixel area;

preparing a second substrate; and filling liquid crystal molecules in a gap between the first substrate and the second substrate, for forming a liquid crystal layer.

Preferably, in the step of preparing the pixel electrode, further comprises:

preparing at least one first transitional pixel area disposed between the main pixel area and the sub-pixel area, a third color resistance thickness of the first transitional pixel area is formed between the first color resistance thickness and the second color resistance thickness; and/or preparing at least one second transitional pixel area disposed on two sides of the first through hole between the TFT and the pixel electrode and/or of the second through hole between the storage capacitor and the pixel electrode, a fourth color resistance thickness of the second transitional pixel area has heights in a gradient range decreasing from the first color resistance thickness of the or the second color resistance thickness.

Compared to the prior art, the LCD panel and the manufacturing method thereof in the present invention improved the displaying effect of its assembled displaying equipment, by different color resistance thicknesses of the main pixel area and the sub-pixel area, may produce different driving efficiency under the same driving voltage, and improve the wide visual display thereby.

BRIEF DESCRIPTION OF THE DRAWINGS

In order to describe clearly the embodiment in the present invention or the prior art, the following will introduce the drawings for the embodiment shortly. Obviously, the following description is only a few embodiments, for the common technical personnel in the field it is easy to acquire some other drawings without creative work.

DETAILED DESCRIPTION OF THE PREFERRED EMBODIMENTS

Please refer to the drawings, wherein the same component symbols represent the same components. The principle of the present invention is implemented in a suitable computing environment for illustrative purposes. The following description is based on the specific illustrated embodiments of the present invention, which should not be construed as limiting the present invention, unless otherwise specified.

Embodiment One

Figure 1:
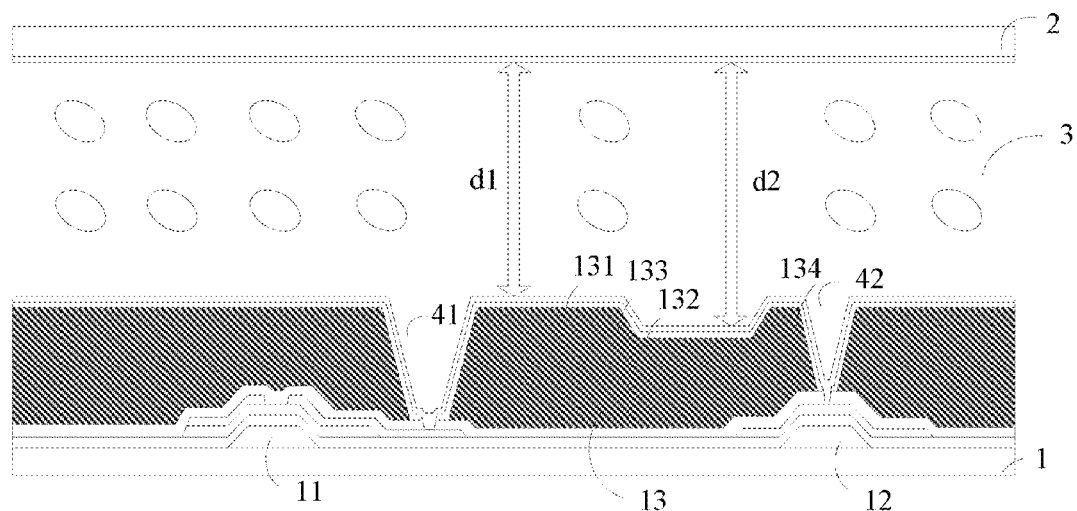
FIG. 1 is a cross-sectional diagram of an LCD panel in a first embodiment of the present invention.

Please refer to FIG. 1, which is a cross-sectional diagram of an LCD panel in a preferred embodiment of the present invention. The LCD panel comprises: a first substrate 1, a second substrate 2, and a liquid crystal layer 3 disposed in a gap between the first substrate 1 and the second substrate 2. Wherein, the LCD panel further comprises the following on the first substrate 1: a TFT 11, a storage capacitor 12 and a pixel electrode 13.

The pixel electrode 13 covers the TFT 11 and storage capacitor 12.

The pixel electrode 13 comprises at least one main pixel area 131 and at least one sub-pixel area 132, and may further comprises at least one first transitional pixel area 133, and/or at least one second transitional pixel area 134.

A first color resistance thickness of the main pixel area 131 is greater than a second color resistance thickness of the sub-pixel area 132, which makes a first cell gap d1 formed in the liquid crystal layer on the main pixel area 131 is less than a second cell gap d2 formed in the liquid crystal layer on the sub-pixel area 132.

Figure 2A:
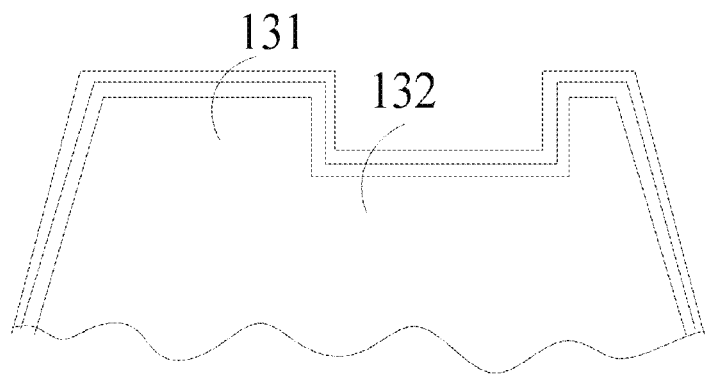
FIG. 2A-FIG. 2D are schematic diagrams of pixel electrodes with varying shapes in the first embodiment of the present invention, respectively.
Figure 2B:
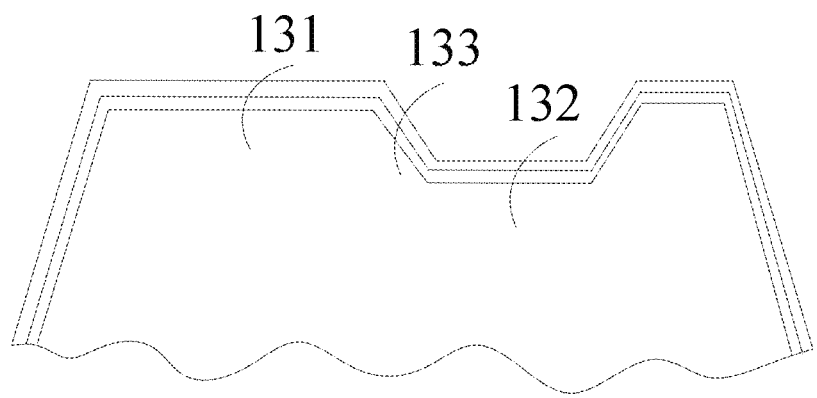
Figure 2C:
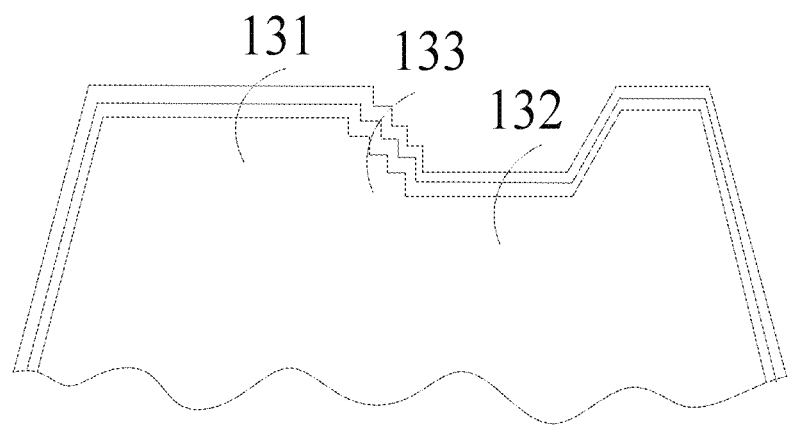
Figure 2D:
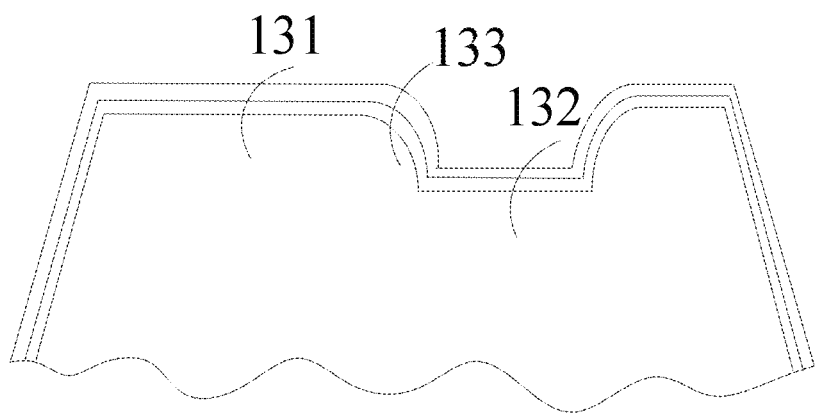

It should be understood that, there is an optimum matching value between the cell gap and double direct transmittance rate and a screw pitch in the liquid crystal layer 3. Various matching value in one LCD panel will lead different response efficiency in the liquid crystal layer. In the present invention, a cell gap of the main pixel area 131 is thinner than a cell gap of the sub-pixel area 132, the difference of the cell gaps is at least more than 0.2 micrometers, to ensure a obverse corresponding difference between liquid crystal molecules corresponding to the main pixel area 131 and the liquid crystal molecules corresponding to the sub-pixel area 132. It should be understood that, referring to FIG. 2A to FIG. 2D, it may be a direct transition (shown in FIG. 2A) between the main pixel area 131 and sub-pixel area 132, or may comprise at least one first transitional pixel area 133 disposed between the main pixel area 131 and the sub-pixel area 132, a third color resistance thickness of the first transitional pixel area 133 is between the first color resistance thickness of the main pixel area 131 and the second color resistance thickness of the sub-pixel area 132, and the third color resistance thickness is a preset height or has heights in a gradient range. Wherein the preset height is between the first color resistance thickness and the second color resistance thickness, and no need to repeat. And the first transitional pixel area may be shaped to be triangular (shown in FIG. 2B), stepped (shown in FIG. 2C) or circular arc out of convex (shown in FIG. 2D).

In addition, it should be explained that, the term of color resistance thickness here, is mentioned a height from the substrate to the top surface of the color resistance. Even if part of the bottom surface of the color resistance covered parts of the TFT or the storage capacitor, the term of color resistance thickness is also mentioned the height from the first substrate.

The color resistance in the pixel electrode 13, is formed by three color filter layers of red, green, and blue (RGB) tiered color filter layer overlaying on the TFT 11. Both of the color resistance and the TFT form a color filter on array (COA) structure. Since the color resistance is directly formed on the TFT 11, no alignment error will occur. Therefore, the COA structure itself can provide a better resolution and a preferable pixel opening ratio.

Figure 3:
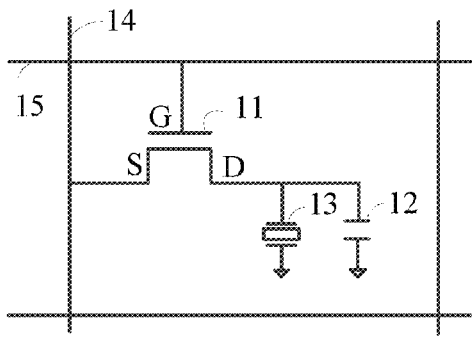
FIG. 3 is a schematic diagram of an equivalent circuit of a TFT in the first embodiment of the present invention.

Please refer to FIG. 3, which is a schematic diagram of effect of the TFT. the TFT 11 comprises a source electrode S, a gate electrode G and a drain electrode, which connected to a data line 14, a scanning line 15 and the pixel electrode 13 and the storage capacitor 12 respectively, for controlling pixel electrode 13 to switch on and off.

Figure 4:
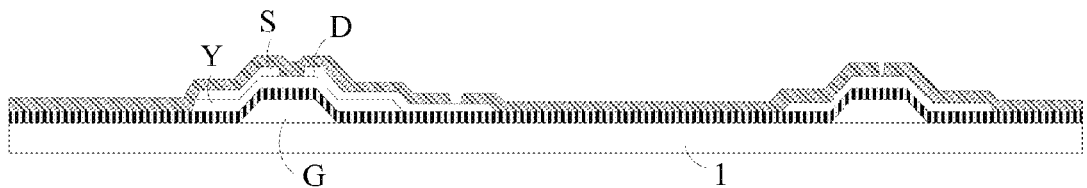
FIG. 4 is a cross-sectional diagram of the TFT in the first embodiment of the present invention.

Please referring to FIG. 3 and FIG. 4, the TFT 11 comprises the following:

a gate electrode G, which is connected to the scanning line 15, is primarily made of metal;

a source electrode S, which is disposed on an active layer Y, and connected to the data line 14, for receiving inputted electrons;

a drain electrode D, which is disposed on the active layer Y, and connected to the pixel electrode, for outputting the electrons in order to control the pixel electrode 13 switching on and off;

an insulating layer which is laid on the gate electrode G; and an active layer, which is laid on the insulating layer, made of IGZO (Indium Gallium Zinc Oxide), for forming an electric conducting channel. It should be understood that the transparent amorphous oxide semiconductors (TAOS) represented as the IGZO has the advantage as high mobility, good uniformity and transparent, which can improve the driving efficiency of the TFT.

The LCD panel runs one horizontal scanning line 15 at a time, to turn on the TFT 11 connected to the one scanning line 15, while inputs a corresponding video signal via a vertical data line 14, for charging the pixel electrode 13 to a proper voltage. Then close the TFT 11 until re-input a signal next time to, in the interval the charge is retained in the storage capacitor 12; And runs another vertical scanning line 15 to input the corresponding video signal. So that the visual data of the entire image is inputted in order as the above, and re-input a signal from the start (typically repeated frequency is 60-70 Hz).

In addition, as shown in FIG. 1, a first through hole 41 is formed in the pixel electrode 13, the first through hole 41 penetrates from the pixel electrode 13 to the TFT 11. A metal layer is laid to on a surface of the pixel electrode 13 and the first through hole 41 to form the data line 14. The data line 14 is connected to the pixel electrode 13, for controlling the rotation of the liquid crystal molecules in the liquid crystal layer.

A second through hole 42 is formed in the pixel electrode 13, the second through hole 42 penetrates from the pixel electrode 13 to the storage capacitor 12, and then a metal layer is laid on a surface of the pixel electrode 13 and the second through hole 42, for connecting the pixel electrode 13 and the storage capacitor 12.

It should be understood that, the second transitional pixel area 134, which is disposed on the two sides of the first through hole 41 and/or the second through hole 42, a fourth color resistance the thickness of the second transitional area 134 has heights in a gradient range decreasing from the first color resistance thickness or from the second color resistance thickness. Also, the second transitional pixel area is shaped to be triangular, stepped or circular arc.

The LCD panel in the present invention, due to difference thicknesses of the color resistances of the main pixel area 131 from that of the sub-pixel area 132, the liquid crystal response speeds in the cell gap thereon are also different. Therefore, when the same voltage is applied, different response efficiency can be presented, and the light penetration is also improved, thereby the LCD panel improves the displaying effect of a large view of its assembled displaying equipment.

Embodiment Two

Figure 5:
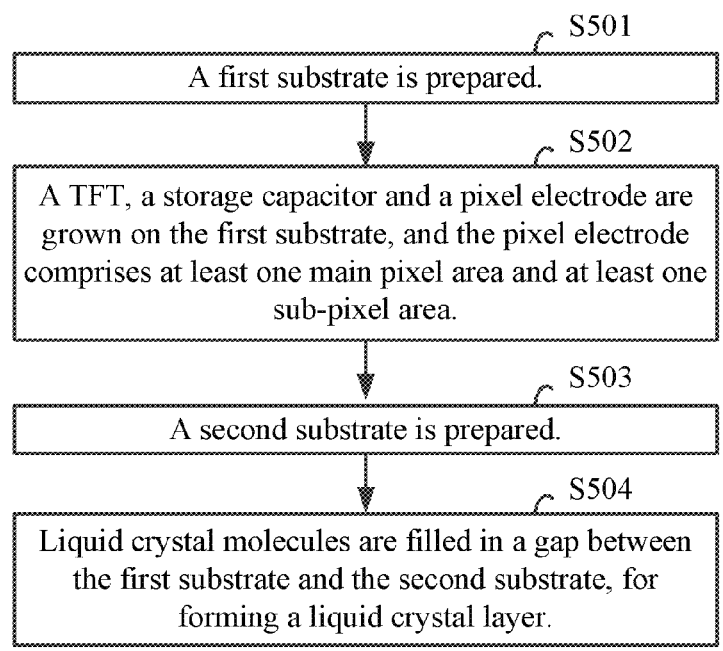
FIG. 5 is a flow chart of a method of manufacturing the LCD panel in a second embodiment of the present invention.

Please refer to FIG. 5, which is a flow chart of the method of manufacturing the LCD panel. It comprises the flowing steps:

In step S501, a first substrate is prepared.

In step S502, a TFT, a storage capacitor and a pixel electrode is grown on the first substrate. Wherein the pixel electrode 13 covers on both the TFT 11 and storage capacitor 12. The pixel electrode 13 comprises at least one main pixel area 131 and at least one sub-pixel area 132, and may further comprises at least one first transitional pixel area 133 and/or at least one second transitional pixel area 134.

Wherein, a first color resistance thickness of the main pixel area 131 is greater than a second color resistance the thickness of the sub-pixel area 132. A third color resistance thickness of the first transitional pixel area 133 is between the first color resistance thickness and the second color resistance thickness. A fourth color resistance thickness of the second transitional pixel area 134 has heights in a gradient range decreasing from the first color resistance thickness or from the second color resistance thickness. The variation thereof may be understood by referring to FIG. 2A to FIG. 2D, which is no repeated here.

Figure 6:
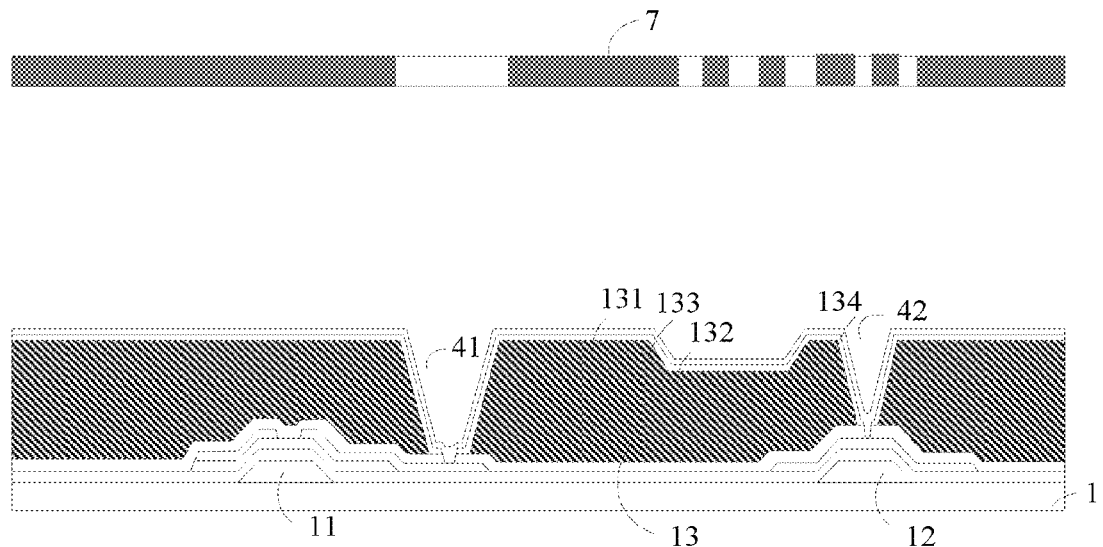
FIG. 6 is a schematic diagram of an exposing process in the second embodiment of the present invention.

Concretely speaking, at least the processes shown in FIG. 6 should be comprised, so as to form the different thicknesses of color resistance.

Figure 7A:
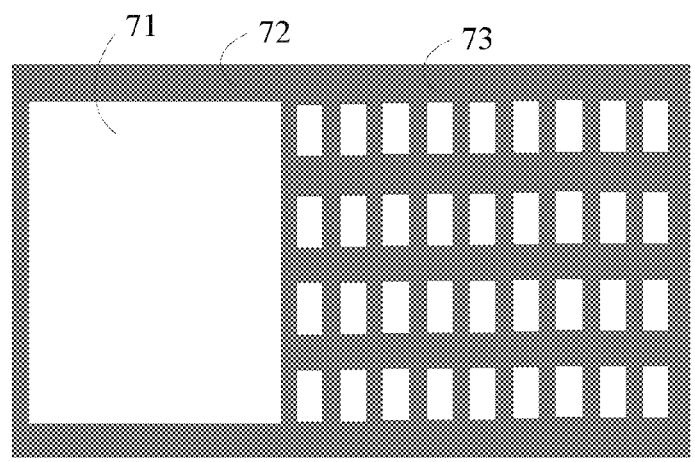
FIG. 7A and FIG. 7B are structural diagrams of a mask in the second embodiment of the present invention, respectively.
Figure 7B:
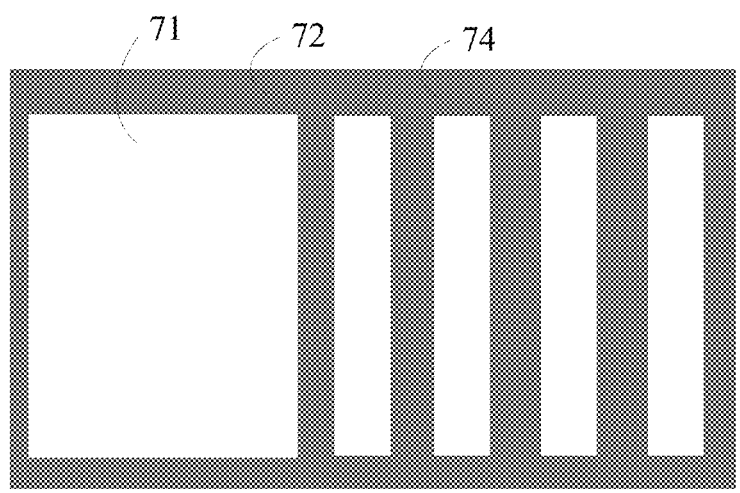

Please refer to exemplary masks illustrated in FIG. 7A and FIG. 7B. The masks 7 comprise a light transmitting section 71, a light blocking section 72, and a partial transmitting section 73 or 74. Wherein the light transmitting section 71 is corresponding to the first through hole 41 and/or second through hole 42, the light blocking section 72 is corresponding to the main pixel area 131 and the four edges of the liquid crystal box sealed by sealant. While the partial transmitting section 73 is corresponding to the sub-pixel area 132, the first transitional pixel area 133 and the second transitional pixel area 134. Wherein the partial transmitting sections 73 or 74, is essentially that the light transmitting section 71 and the light blocking section 72 disposed alternatively, shaped to be strips or nets.

It should be understood that, through the mask designed as above, in a following exposing and developing process, the color resistances thicknesses of the main pixel area, sub-pixel area and the first transitional area as well as the second transitional area can be realized.

In step S503, a second substrate is prepared.

In step S504, liquid crystal molecules are filled in a gap between the first substrate and the second substrate, for forming a liquid crystal layer.

The LCD panel manufactured in the present invention, due to difference thicknesses of the color resistances of the main pixel area 131 from that of the sub-pixel area 132, the liquid crystal response speeds in the cell gap thereon are also different. Therefore, when the same voltage is applied, different response efficiency can be presented, and the light penetration is also improved, thereby the LCD panel improves the displaying effect of a large view of its assembled displaying equipment.

It should be understood that the present invention has been described with reference to certain preferred and alternative embodiments which are intended to be exemplary only and do not limit the full scope of the present invention as set fourth in the appended claims.

What is claimed is:

1. An LCD panel, comprising a first substrate, a second substrate, and a liquid crystal layer between the first substrate and the second substrate, wherein the LCD panel further comprises the following on the first substrate:
   a pixel electrode comprising at least one main pixel area, at least one sub-pixel area, at least one first transitional pixel area, and at least one second transitional pixel area, wherein a first color resistance thickness of the main pixel area is greater than a second color resistance thickness of the sub-pixel area, the first transitional pixel area is disposed between the main pixel area and the sub-pixel area, a third color resistance thickness of the first transitional pixel area is between the first color resistance thickness and the second color resistance thickness, and the third color resistance thickness is a preset height or has heights in a gradient range, the second transitional pixel area is disposed on one side or two sides of a first through hole and/or a second through hole, and a fourth color resistance thickness of the second transitional pixel area has heights in a gradient range decreasing from the first color resistance thickness or from the second color resistance thickness;
   a TFT connected to a data line, a scanning line, and the pixel electrode respectively; and
   a storage capacitor connected to the pixel electrode;
   wherein the first through hole penetrates from the pixel electrode into the TFT, and a metal layer is laid on a surface of the pixel electrode and the first through hole to form the data line for connecting the data line to the pixel electrode.

2. The LCD panel as claimed in claim 1, wherein the first transitional pixel area is shaped to be triangular, stepped, or circular arc.

3. The LCD panel as claimed in claim 1, wherein the second through hole penetrates from the pixel electrode to the storage capacitor, and a metal layer is laid on the surface of the pixel electrode and the second through hole, for connecting the pixel electrode and the storage capacitor.

4. The LCD panel as claimed in claim 3, wherein the second transitional pixel area is shaped to be triangular, stepped, or circular arc.

5. The LCD panel as claimed in claim 1, wherein the TFT comprises:
   a gate electrode connected to the scanning line;
   a source electrode connected to the data line for receiving putted electrons;
   a drain electrode connected to the pixel electrode, for outputting the electrons; and
   an active layer made by indium gallium zinc oxide, for forming an electric conducting channel.

6. An LCD panel, comprising a first substrate, a second substrate, and a liquid crystal layer between the first substrate and the second substrate, wherein the LCD panel further comprises the following on the first substrate:
   a pixel electrode comprising at least one main pixel area and at least one sub-pixel area, wherein a first color resistance thickness of the main pixel area is greater than a second color resistance thickness of the sub-pixel area;
   a TFT connected to a data line, a scanning line and the pixel electrode respectively; and
   a storage capacitor connected to the pixel electrode;
   wherein a first through hole is formed on the pixel electrode, the first through hole penetrates from the pixel electrode to the TFT, and a metal layer is laid on a surface of the pixel electrode and the first through hole to form the data line, for connecting the data line to the pixel electrode.

7. The LCD panel as claimed in claim 6, wherein the pixel electrode further comprises at least one first transitional pixel area disposed between the main pixel area and the sub-pixel area, a third color resistance thickness of the first transitional pixel area is between the first color resistance thickness and the second color resistance thickness, and the third color resistance thickness is a preset height or has heights in a gradient range.

8. The LCD panel as claimed in claim 7, wherein the first transitional pixel area is shaped to be triangular, stepped, or circular arc.

9. The LCD panel as claimed in claim 6, wherein a second through hole is formed on the pixel electrode, the second through hole penetrates from the pixel electrode to the storage capacitor, and the metal layer is laid on the surface of the pixel electrode and the second through hole, for connecting the pixel electrode and the storage capacitor.

10. The LCD panel as claimed in claim 9, wherein the pixel electrode further comprises a second transitional pixel area disposed on one side or two sides of the first through hole and/or the second through hole, a fourth color resistance thickness of the second transitional pixel area has heights in a gradient range decreasing from the first color resistance thickness or from the second color resistance thickness.

11. The LCD panel as claimed in claim 10, wherein the second transitional pixel area is shaped to be triangular, stepped, or circular arc.

12. The LCD panel as claimed in claim 6, wherein the TFT comprises:
   a gate electrode connected to the scanning line;
   a source electrode connected to the data line, for receiving inputted electrons;
   a drain electrode connected to the pixel electrode, for outputting the electrons; and
   an active layer made by indium gallium zinc oxide, for forming an electric conducting channel.

13. A manufacturing method for an LCD panel, comprising the following steps:
   preparing a first substrate;
   preparing a TFT, a storage capacitor and a pixel electrode on the first substrate, the pixel electrode comprising at least one main pixel area and at least one sub-pixel area, a first color resistance thickness of the main pixel area is greater than a second color resistance thickness of the sub-pixel area;
   preparing a second substrate; and
   filling liquid crystal molecules in a gap between the first substrate and the second substrate, for forming a liquid crystal layer;
   wherein a first through hole is formed on the pixel electrode, the first through hole penetrates from the pixel electrode to the TFT, and a metal layer is laid on a surface of the pixel electrode and the first through hole to form a data line, for connecting the data line to the pixel electrode.

14. The manufacturing method as claimed in claim 13, wherein the step of preparing the pixel electrode, further comprises:

preparing at least one first transitional pixel area disposed between the main pixel area and the sub-pixel area, a third color resistance thickness of the first transitional pixel area is formed between the first color resistance thickness and the second color resistance thickness; and/or preparing at least one second transitional pixel area disposed on two sides of the first through hole between the TFT and the pixel electrode, and/or a second through hole between the storage capacitor and the pixel electrode, a fourth color resistance thickness of the second transitional pixel area has heights in a gradient range decreasing from the first color resistance thickness or from the second color resistance thickness.

\* \* \* \* \*